(12) United States Patent
Kim

(10) Patent No.: US 9,331,303 B2
(45) Date of Patent: May 3, 2016

(54) ORGANIC LIGHT-EMITTING DIODE LIGHTING APPARATUS

(71) Applicant: Samsung Display Co., Ltd., Yongin, Gyunggi-Do (KR)

(72) Inventor: Jin-Kwang Kim, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/460,249

(22) Filed: Aug. 14, 2014

(65) Prior Publication Data

US 2014/0353655 A1 Dec. 4, 2014

Related U.S. Application Data

(62) Division of application No. 12/846,731, filed on Jul. 29, 2010, now Pat. No. 8,841,654.

(30) Foreign Application Priority Data

Oct. 29, 2009 (KR) ........................ 10-2009-0103763

(51) Int. Cl.
*H01L 29/08* (2006.01)
*H01L 51/52* (2006.01)

(52) U.S. Cl.
CPC .......... *H01L 51/5215* (2013.01); *H01L 51/529* (2013.01); *H01L 51/5218* (2013.01); *H01L 51/5234* (2013.01); *H01L 51/5271* (2013.01); *H01L 51/5212* (2013.01)

(58) Field of Classification Search
CPC .............. H01L 27/32; H01L 2227/326; H01L 27/3202–27/3297; H01L 51/50; H01L 51/5012; H01L 2251/50–2251/568
See application file for complete search history.

(56) References Cited

U.S. PATENT DOCUMENTS

| 5,965,280 A | 10/1999 | Roitman et al. |
| 6,713,955 B1 | 3/2004 | Roitman et al. |
| 6,759,940 B2 | 7/2004 | Mazzochette |

(Continued)

FOREIGN PATENT DOCUMENTS

| DE | 69732903 T2 | 2/2006 |
| DE | 102004057379 B3 | 8/2006 |

(Continued)

OTHER PUBLICATIONS

Chatterjee et al., "A miniature PTC thermistor based sensor element fabricated by tape casting technique," Sensors and Actuators B 60, 155-160, 1999.

*Primary Examiner* — David Vu
*Assistant Examiner* — Cuong Nguyen
(74) *Attorney, Agent, or Firm* — Knobbe, Martens, Olson & Bear, LLP

(57) ABSTRACT

Disclosed herein is an organic light-emitting diode lighting apparatus. The organic light-emitting diode lighting apparatus may include a transparent substrate main body with a plurality of groove lines formed therein, auxiliary electrodes formed in at least of the plurality of groove lines, a first electrode formed on the substrate main body, positive temperature coefficients configured to connect the auxiliary electrodes and the first electrode, an organic emission layer formed on the first electrode, and/or a second electrode formed on the organic emission layer.

14 Claims, 4 Drawing Sheets

(56) References Cited

U.S. PATENT DOCUMENTS

| | | |
|---|---|---|
| 2002/0038998 A1 | 4/2002 | Fujita et al. |
| 2006/0017371 A1 | 1/2006 | Yamada |
| 2006/0022206 A1 | 2/2006 | Hayakawa et al. |
| 2006/0164408 A1 | 7/2006 | Nishikawa et al. |
| 2009/0224261 A1 | 9/2009 | Takahashi et al. |
| 2010/0038357 A1 | 2/2010 | Fukuda et al. |

FOREIGN PATENT DOCUMENTS

| | | |
|---|---|---|
| JP | 09-199307 | 7/1997 |
| JP | 2008-078024 | 4/2008 |
| WO | WO 2008/051370 | 5/2008 |
| WO | WO 2008/091001 A2 | 7/2008 |

ORGANIC LIGHT-EMITTING DIODE LIGHTING APPARATUS

CROSS-REFERENCE TO RELATED APPLICATIONS

This application is a divisional application of U.S. patent application Ser. No. 12/846,731 filed Jul. 29, 2010, now pending, and further claims the benefit of Korean Patent Application No. 10-2009-0103763 filed in the Korean Intellectual Property Office on Oct. 29, 2009. The disclosure of each of U.S. patent application Ser. No. 12/846,731 and Korean Patent Application No. 10-2009-0103763 is incorporated herein in its entirety by reference.

BACKGROUND

1. Field of the Invention

The described technology relates generally to a lighting apparatus, and more particularly, to an organic light-emitting diode lighting apparatus using organic light emitting diodes (OLEDs).

2. Description of the Related Art

An OLED includes a hole injection electrode, an organic emission layer and an electron injection electrode. The OLED is configured to emit light when electrons combine with holes within the organic emission layer and drop to a ground state. An organic light-emitting diode lighting apparatus is a lighting apparatus using OLEDs and functions as a surface light source. Thus, the organic light-emitting diode lighting apparatus may be used for various applications by making use of the merits of the surface light source.

At least one of the hole injection electrode and the electron injection electrode of the organic light-emitting diode lighting apparatus includes a transparent conductive material capable of transmitting light. The transparent conductive material has relatively high sheet resistance. Thus, if the electrode is made of the transparent conductive material, luminance becomes non-uniform due to an unnecessary voltage drop.

Furthermore, although the organic light-emitting diode lighting apparatus is a surface light source, the organic emission layer that emits light will emit rays of light in several directions. Accordingly, in the organic emission layer, light emitted in a direction in which the hole injection electrode crosses the electron injection electrode is effectively used, but rays of light emitted in other directions are lost.

In general, an OLED is sensitive to a change in temperature, so the amount of current of the OLED is increased according to a rise in the temperature. Accordingly, if temperature rises during the operation of the organic light-emitting diode lighting apparatus, luminance differs at every portion of the OLED according to the degree of heat generated from the corresponding portion. As described above, a problem arises because the luminance of the organic light-emitting diode lighting apparatus becomes non-uniform according to a change in temperature.

SUMMARY OF CERTAIN INVENTIVE ASPECTS

In one aspect, an organic light-emitting diode lighting apparatus is provided for improving efficiency of light and also securing uniformity of luminance.

In another aspect, an organic light-emitting diode lighting apparatus includes, for example, a transparent substrate main body with a plurality of groove lines formed therein; auxiliary electrodes formed in at least one of the plurality of groove lines; a first electrode formed on the substrate main body; positive temperature coefficients (PTCs) configured to connect the auxiliary electrodes and the first electrode; an organic emission layer formed on the first electrode; and a second electrode formed on the organic emission layer.

In some embodiments, the PTCs each comprise a pair of resistance electrodes and a polymer layer disposed between the pair of resistance electrodes. In some embodiments, the PTCs are formed on the plurality of groove lines. In some embodiments, the organic light-emitting diode lighting apparatus further includes a thermistor insulating layer surrounding edges of the PTCs. In some embodiments, the PTCs are formed within the plurality of respective groove lines along with the respective auxiliary electrodes. In some embodiments, the auxiliary electrodes each have a thickness in a range of about 2 μm to about 100 μm. In some embodiments, the plurality of groove lines has a depth of less than about 50% of a thickness of the substrate main body. In some embodiments, the auxiliary electrodes each have a width in a range of about 1 μm to about 50 μm. In some embodiments, a total area occupied by the auxiliary electrodes is less than or equal to about 15% of an area where the organic emission layer emits light. In some embodiments, the first electrode comprises transparent materials and the second electrode comprises reflective materials. In some embodiments, the first electrode has a thickness of about 200 nm or less. In some embodiments, the auxiliary electrodes comprise conductive reflection materials having lower specific resistance than that of the first electrode. In some embodiments, the substrate main body comprises glass-based materials and the substrate main body has a thickness in a range of about 0.2 mm to about 1.2 mm. In some embodiments, the substrate main body comprises plastic-based materials and is formed at a thickness ranging from about 0.01 mm to about 1 mm. In some embodiments, the organic light-emitting diode lighting apparatus further includes barrier rib layers formed between the first electrode and the second electrode. In some embodiments, the barrier rib layers are configured to overlap the respective auxiliary electrodes.

BRIEF DESCRIPTION OF THE DRAWINGS

Features of the present disclosure will become more fully apparent from the following description and appended claims, taken in conjunction with the accompanying drawings. It will be understood these drawings depict only certain embodiments in accordance with the disclosure and, therefore, are not to be considered limiting of its scope; the disclosure will be described with additional specificity and detail through use of the accompanying drawings. An apparatus according to some of the described embodiments can have several aspects, no single one of which necessarily is solely responsible for the desirable attributes of the apparatus. After considering this discussion, and particularly after reading the section entitled "Detailed Description of Certain Inventive Embodiments" one will understand how illustrated features serve to explain certain principles of the present disclosure.

DETAILED DESCRIPTION OF CERTAIN INVENTIVE EMBODIMENTS

Figure 1:
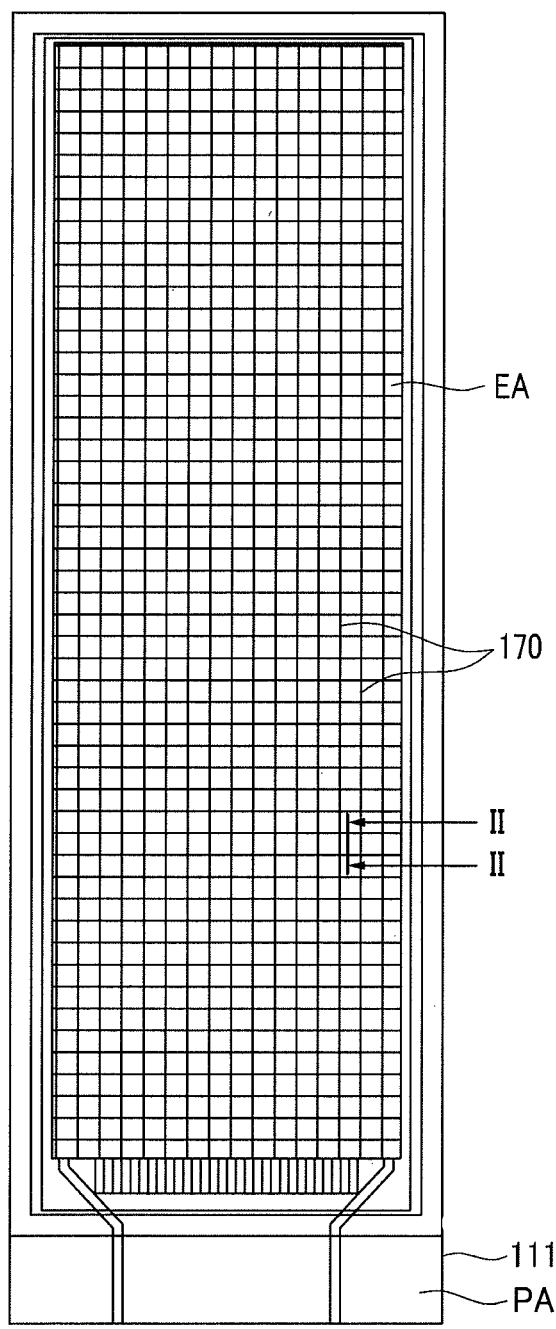
FIG. 1 is layout diagram of an organic light-emitting diode lighting apparatus according to a first exemplary embodiment.

In the following detailed description, only certain exemplary embodiments have been shown and described, simply by way of illustration. As those skilled in the art would realize, the described embodiments may be modified in various different ways, all without departing from the spirit or scope of the present disclosure. Further, in several exemplary embodiments, constituent elements having the same construction are assigned the same reference numerals and are representatively described in connection with a first exemplary embodiment. In the remaining exemplary embodiments, constituent elements different from those of the first exemplary embodiment are described. To clarify the description of the exemplary embodiments, the same reference numbers will be used throughout the drawings to refer to the same or like parts. Further, the size and thickness of each of the elements shown in the drawings are arbitrarily shown for better understanding and ease of description, and the embodiments are not limited thereto.

In addition, in the drawings, the thickness of layers, films, panels, regions, etc., are exaggerated for clarity. The thickness of the layers, films, panels, regions, etc., is enlarged in the drawings for better understanding and ease of description. Accordingly, the drawings and description are to be regarded as illustrative in nature and not restrictive. It will be understood that when an element such as a layer, film, region, or substrate is referred to as being "on" another element, it can be directly on the other element or intervening elements may also be interposed therebetween. Also, when an element is referred to as being "connected to" another element, it can be directly connected to the other element or be indirectly connected to the other element with one or more intervening elements interposed therebetween.

Hereinafter, a first exemplary embodiment is described with reference to FIGS. 1 to 3.

Figure 2:
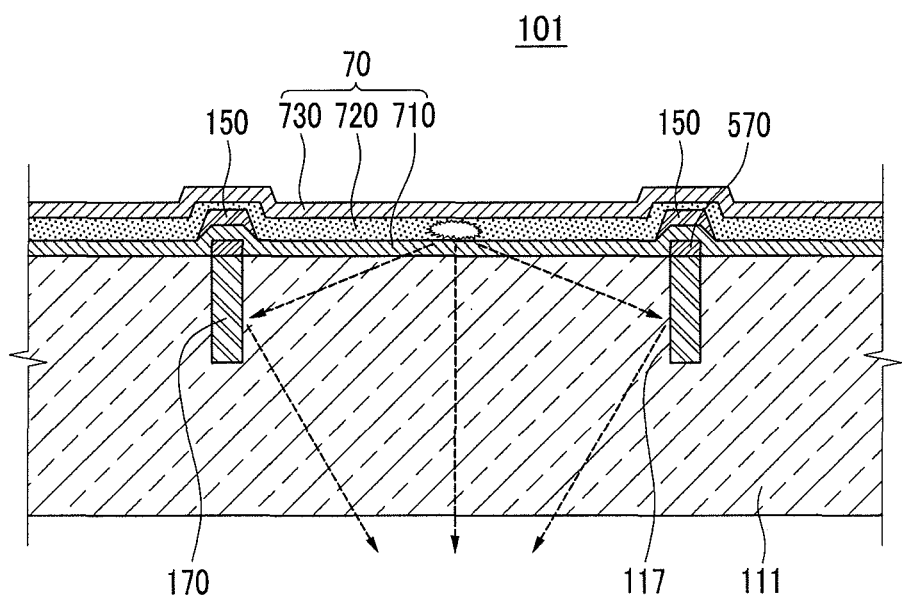
FIG. 2 is a cross-sectional view of the organic light-emitting diode lighting apparatus taken along line II-II of FIG. 1.
Figure 3:
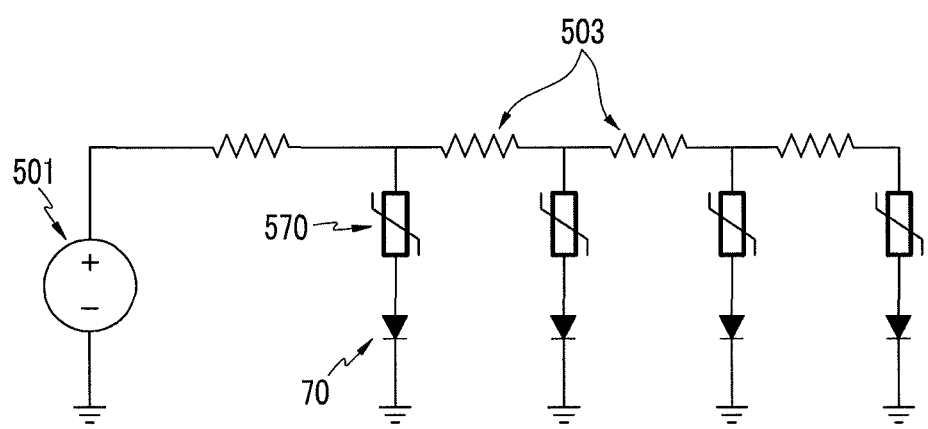
FIG. 3 is a circuit diagram of the organic light-emitting diode lighting apparatus shown in FIG. 1.

As shown in FIGS. 1 and 2, an organic light-emitting diode lighting apparatus 101 includes a substrate main body 111, auxiliary electrodes 170, positive temperature coefficients (PTCs) 570, a first electrode 710, an organic emission layer 720, and a second electrode 730. The first electrode 710, the organic emission layer 720, and the second electrode 730 are the major elements of an OLED. The organic light-emitting diode lighting apparatus 101 may further include barrier rib layers 150. The substrate main body 111 may include, for example, a transparent insulating material. In more detail, the substrate main body 111 can be formed of an insulating substrate such as glass, quartz, ceramics, or plastic. The substrate main body 111 may be partitioned into a light emitting region EA and a pad region PA.

As shown in FIG. 2, a plurality of groove lines 117 may be formed in the substrate main body 111. The plurality of groove lines 117 may be formed in various geometric patterns, including, for example, a stripe pattern and a lattice pattern. The substrate main body 111 can include glass-based materials. Here, the substrate main body 111 has a thickness in the range of about 0.2 mm to about 1.2 mm. The thickness of the substrate main body 111 can be variously set according to materials, processing methods, purposes, etc. If the thickness of the substrate main body 111 is less than about 0.2 mm, the substrate main body 111 is difficult to stably support several thin films to be formed thereon. On the other hand, if the substrate main body 111 has a thickness of more than about 1.2 mm, a total thickness of the organic light-emitting diode lighting apparatus 101 becomes unnecessarily thick, the manufacturing cost is increased, and productivity can be low.

It is to be noted that the first exemplary embodiment is not limited to the above description. For example, the substrate main body 111 may include, for example, plastic-based materials. Further, the substrate main body 111 may include, for example, materials such as polyimide (PI) with an excellent heat-resistance property. If the substrate main body 111 includes plastic-based materials, it can have a thickness in the range of about 0.01 mm to about 1 mm. Further, a flexible organic light-emitting diode lighting apparatus 101 can be formed.

In the case in which the substrate main body 111 is formed to have a relatively very thin thickness of about 0.1 mm or less, the organic light-emitting diode lighting apparatus 101 may be fabricated by a method of forming the substrate main body 111 made of plastic materials on a glass substrate (not shown), forming several thin films over the substrate main body 111 to thereby complete the organic light-emitting diode lighting apparatus 101, and then separating the substrate main body 111 and the glass substrate (not shown).

As the thickness of the substrate main body 111 decreases, a flexible organic light-emitting diode lighting apparatus 101 can be formed more effectively. However, if the thickness of the substrate main body 111 is less than about 0.01 mm, manufacture of the substrate main body 111 is difficult, and it is difficult for the substrate main body 111 to stably support several thin films. If the substrate main body 111 has a thickness of more than about 1 mm, the total thickness of the organic light-emitting diode lighting apparatus 101 becomes unnecessarily thick.

The depth of the plurality of groove lines 117 is less than about 50% compared with the thickness of the substrate main body 111. If the depth of the plurality of groove lines 117 is more than about 50% compared with the thickness of the substrate main body 111, the strength of the substrate main body 111 can be deteriorated. That is, the substrate main body 111 can be easily broken or damaged along the groove lines 117.

As shown in FIG. 2, the auxiliary electrodes 170 may be formed to fill the plurality of respective groove lines 117. The exemplary embodiment is not limited to the structure in which the auxiliary electrode 170 is formed to be flat on a surface of the substrate main body 111, as shown in FIG. 2. For example, the auxiliary electrode 170 may have a structure in which part of the auxiliary electrode 170 is protruded over the surface of the substrate main body 111.

The auxiliary electrodes 170 may include, for example, conductive reflection materials. That is, the auxiliary electrodes 170 are made of metallic materials having low specific resistance and a light-reflecting property. For example, the auxiliary electrodes 170 may be made of materials such as lithium (Li), calcium (Ca), lithium fluoride/calcium (LiF/Ca), lithium fluoride/aluminum (LiF/Al), aluminum (Al), silver (Ag), magnesium (Mg), or gold (Au). The auxiliary electrodes 170 may be formed to fill the plurality of respective groove lines 117, and together with the groove lines 117, are formed in various geometric patterns, such as a stripe pattern or a lattice pattern.

The auxiliary electrodes 170 each have a thickness in the range of about 2 μm to about 100 μm. Here, the thickness refers to a length in a direction intersecting the substrate main body 111. Further, the auxiliary electrodes 170 each have a width in the range of about 1 μm to about 50 μm.

The auxiliary electrodes 170 may function to improve the electrical characteristic of the first electrode 710. In more detail, the auxiliary electrodes 170 function to improve the sheet resistance of the first electrode 710. The auxiliary electrodes 170 also function to improve the efficiency of light by reflecting some of rays of light that are simultaneously emitted in several directions from the organic emission layer 720. That is, the auxiliary electrodes 170 function to condense light that is externally emitted from the organic emission layer 720 via the substrate main body 111. Arrows indicated by dotted line in FIG. 2 refer to the paths of light generated from the organic emission layer 720. As described above, the organic light-emitting diode lighting apparatus 101 can effectively improve the efficiency of light through the auxiliary electrodes 170.

If the auxiliary electrodes 170 each have a thickness of less than about 2 μm, the electrical characteristic of the first electrode 710 cannot be effectively improved. Further, in order for the auxiliary electrodes 170 to each have a thickness of more than about 100 μm, the depth of the groove lines 117 in which the respective auxiliary electrodes 170 are filled must be deep. Accordingly, the total thickness of the substrate main body 111 may be unnecessarily increased. If the auxiliary electrodes 170 each have a width of less than about 1 μm, they cannot be stably formed. Further, if the auxiliary electrodes 170 each have a width of more than about 50 μm, the area of a valid light emitting region from which light is actually emitted is reduced, and the luminance of the organic light-emitting diode lighting apparatus 101 can become non-uniform.

The auxiliary electrodes 170 may be elongated between the light emitting region EA to the pad region PA of the substrate main body 111. The auxiliary electrodes 170, elongated to the pad region PA of the substrate main body 111, are connected to an external power source in the pad region PA.

The PTCs 570 are formed on the plurality of respective groove lines 117. The PTCs 570 each are disposed between the auxiliary electrode 170 and the first electrode 710 and are configured to connect them. If temperature rises, the PTC 570 has a rising resistance. In the first exemplary embodiment, the PTC 570 has a surface mounting-type structure in which several thin films are formed. For example, the PTC 570 can include a pair of resistance electrodes and a polymer layer disposed between the pair of resistance electrodes. Conductive particles are dispersed within the polymer layer. Polyethylene, polypropylene, an ethylene/propylene polymer, or the like can be used as the polymer layer, and carbon black or particles of metallic materials can be used as the conductive particles. However, the first exemplary embodiment is not limited to the above description. For example, the PTC 570 can have a variety of structures using various types of materials that are known to those having ordinary skill in the art.

The PTC 570 enables the organic light-emitting diode lighting apparatus 101 to have a uniform luminance on the whole. The OLED (referring to reference numeral 70 in FIG. 3) is sensitive to a change in the temperature. With a rise in the temperature, the amount of current of the OLED is increased. Accordingly, the OLED emits light of a relatively high luminance in a region having a high temperature, resulting in a poor uniformity of luminance. As shown in FIG. 3, however, in the first exemplary embodiment, the PTC 570 is disposed between the first electrode (referring to reference numeral 710 in FIG. 2) of the OLED 70 and the auxiliary electrode 170 and is configured to connect them. The PTC 570 can reduce the amount of power supplied from a power source unit 501 to the OLED 70 because it has rising resistance when temperature rises. Accordingly, the PTC 570 can offset an increase in the amount of current of the OLED 70. In other words, the PTC 570 can suppress luminance from becoming non-uniform even though the temperature of the organic light-emitting diode lighting apparatus 101 rises.

The organic light-emitting diode lighting apparatus 101 can further include elements such as resistance elements 503, in addition to the PTCs 570 for the purpose of stable driving.

Referring back to FIG. 2, the first electrode 710 may be formed on the substrate main body 111 and may be connected to the auxiliary electrodes 170 through the PTCs 570. The first electrode 710 may include, for example, transparent conductive materials. The transparent conductive materials used for the first electrode 710 can include, for example, indium tin oxide (ITO), indium zinc oxide (IZO), zinc oxide (ZnO), or indium oxide ($In_2O_3$).

The first electrode 710 made of a transparent conductive material as described above has a relatively higher specific resistance than the auxiliary electrodes 170. That is, with an increase in the area of the first electrode 710, it is difficult to make current flowing through the first electrode 710 uniform on the whole. If the organic light-emitting diode lighting apparatus 101 includes the first electrode 710 without the auxiliary electrodes, sheet resistance will rise, leading to a voltage drop. Accordingly, light emitted from the organic emission layer 720 disposed between the first electrode 710 and the second electrode 730 generally has non-uniform luminance according to an increase in the area of the first electrode 710. In the first exemplary embodiment, however, the auxiliary electrodes 170 help current flowing through the first electrode 710 to become generally uniform even though the area of the first electrode 710 is widened. That is, the auxiliary electrodes 170 compensates for relatively low electric conductivity of the first electrode 710 and so prevents the luminance of light emitted from the organic emission layer 720 of the organic light-emitting diode lighting apparatus 101 from becoming generally non-uniform.

Furthermore, the first electrode 710 has a thickness of less than about 200 nm. With a reduction in the thickness of the first electrode 710, sheet resistance of the first electrode 710 increases. However, since the auxiliary electrodes 170 compensate for the relative high sheet resistance of the first electrode 710, the first electrode 710 can have a thinner thickness. If the thickness of the first electrode 710 becomes thin, the transmittance of light is increased, thereby being capable of further improving the efficiency of light.

The barrier rib layers 150 may be formed between the first electrode 710 and the second electrode 730 at the position where the barrier rib layer 150 overlaps the auxiliary electrode 170. The barrier rib layers 150 partition the light emitting region EA in which the OLEDs, each composed of the first electrode 710, the organic emission layer 720, and the second electrode 730, actually emit light into several cells. If a defect such as a short-circuit occurs in one region of the organic light-emitting diode lighting apparatus 101, the barrier rib layers 150 can function to prevent the defect from spreading into the entire region. The barrier rib layers 150 can include, for example, an insulating material, such as silicon nitride ($SiN_x$) and silicon oxide ($SiO_2$), which are known to those having ordinary skill in the art. In some embodiments, the organic light-emitting diode lighting apparatus 101 the barrier rib layers 150 may be omitted.

The organic emission layer 720 may be formed over the first electrode 710 and the barrier rib layers 150. Furthermore, the organic emission layer 720 may include, for example, low molecular organic materials or polymer organic materials.

The organic emission layer 720 can have a multilayer including one or more of an emission layer, a hole injection layer (HIL), a hole transport layer (HTL), an electron transport layer (ETL), and an electron injection layer (EIL). If the organic emission layer 720 includes all the emission layer, the HIL, the HTL, the ETL, and the EIL, the HIL is disposed on the first electrode 710 (for example, a positive electrode), and the HTL, the emission layer, the ETL, and the EIL are sequentially stacked over the HIL. In some embodiments, the organic emission layer 720 formed over the barrier rib layers 150 may not be configured to emit light. Furthermore, the first exemplary embodiment is not limited to the above description. For example, the organic emission layer 720 may not be formed over the barrier rib layers 150.

A total area occupied by the auxiliary electrodes 170 may include, for example, less than or equal to about 15% of an area in which the organic emission layer 720 emits light. The auxiliary electrodes 170 may not transmit light. Accordingly, if the area occupied by the auxiliary electrodes 170 is too wide, a valid light emitting area in which the organic emission layer 720 emits light is decreased, resulting in poor luminous efficiency.

On the other hand, since the auxiliary electrodes 170 reflect light, the auxiliary electrodes 170 can condense light by reflecting some of rays of light emitted in several directions from the organic emission layer 720.

The second electrode 730 may be formed on the organic emission layer 720 and be an electron injection electrode. The second electrode 730 may include reflective materials. Furthermore, the second electrode 730 can be elongated from the light emitting region EA to the pad region PA of the substrate main body 111. The second electrode 730 elongated to the pad region PA of the substrate main body 111 may be connected to an external power source in the pad region PA.

Although not shown in FIG. 2, the organic light-emitting diode lighting apparatus 101 may further include a sealing member disposed on the second electrode 730 and configured to protect the organic emission layer 720. Here, the space between the sealing member and the substrate main body 111 is sealed tightly. The sealing member can be an insulating substrate made of glass, quartz, ceramics, or plastic, or a metallic substrate made of stainless steel. Alternatively, the sealing member may be formed of one or more organic films or one or more inorganic films, or may be formed of a sealing thin film having one or more inorganic films and one or more organic films stacked thereon.

The organic light-emitting diode lighting apparatus 101 according to the first exemplary embodiment may be configured to effectively improve efficiency of light and uniformity of luminance.

Figure 4:
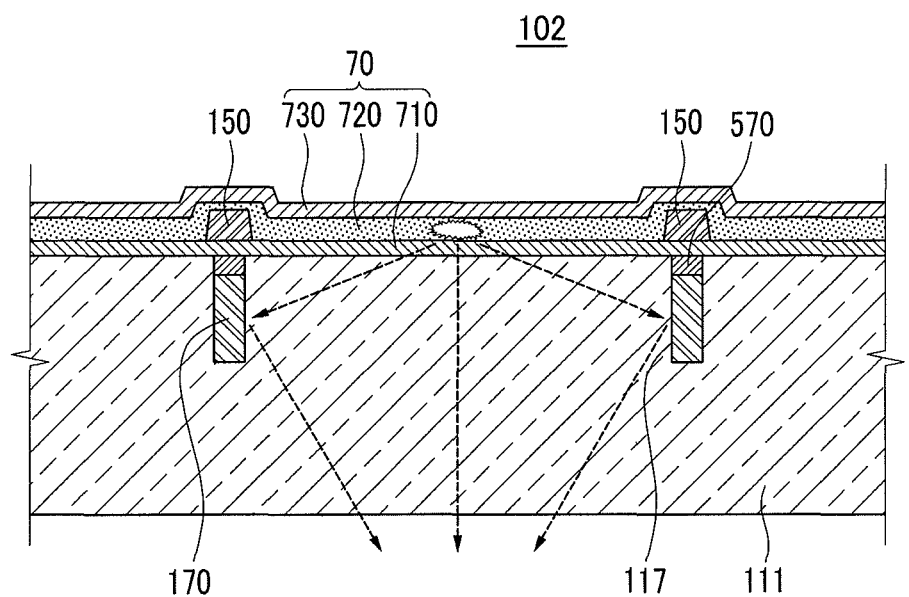
FIG. 4 is a partial cross-sectional view of the organic light-emitting diode lighting apparatus according to a second exemplary embodiment.

Hereinafter, a second exemplary embodiment is described with reference to FIG. 4. As shown in FIG. 4, in an organic light-emitting diode lighting apparatus 102 according to the second exemplary embodiment, PTCs 570, together with auxiliary electrodes 170, are formed within respective groove lines 117 of a substrate main body 111. Accordingly, the PTCs 570 can connect the auxiliary electrodes 170 and the first electrode 710 more stably. According to such a construction, the organic light-emitting diode lighting apparatus 102 can effectively improve efficiency of light and uniformity of luminance.

Figure 5:
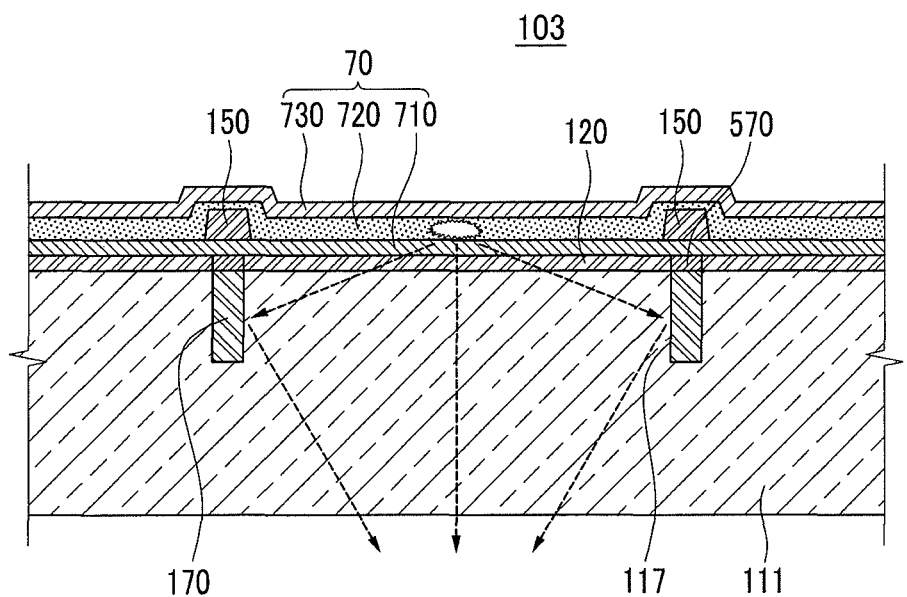
FIG. 5 is a partial cross-sectional view of an organic light-emitting diode lighting apparatus according to a third exemplary embodiment.

Hereinafter, a third exemplary embodiment is described with reference to FIG. 5. As shown in FIG. 5, an organic light-emitting diode lighting apparatus 103 according to the third exemplary embodiment further includes a thermistor insulation layer 120 surrounding the edges of PTCs 570. Accordingly, the PTCs 570 can connect auxiliary electrodes 170 and a first electrode 710 more stably. According to such a construction, the organic light-emitting diode lighting apparatus 103 can effectively improve the efficiency of light and the uniformity of luminance.

Figure 6:
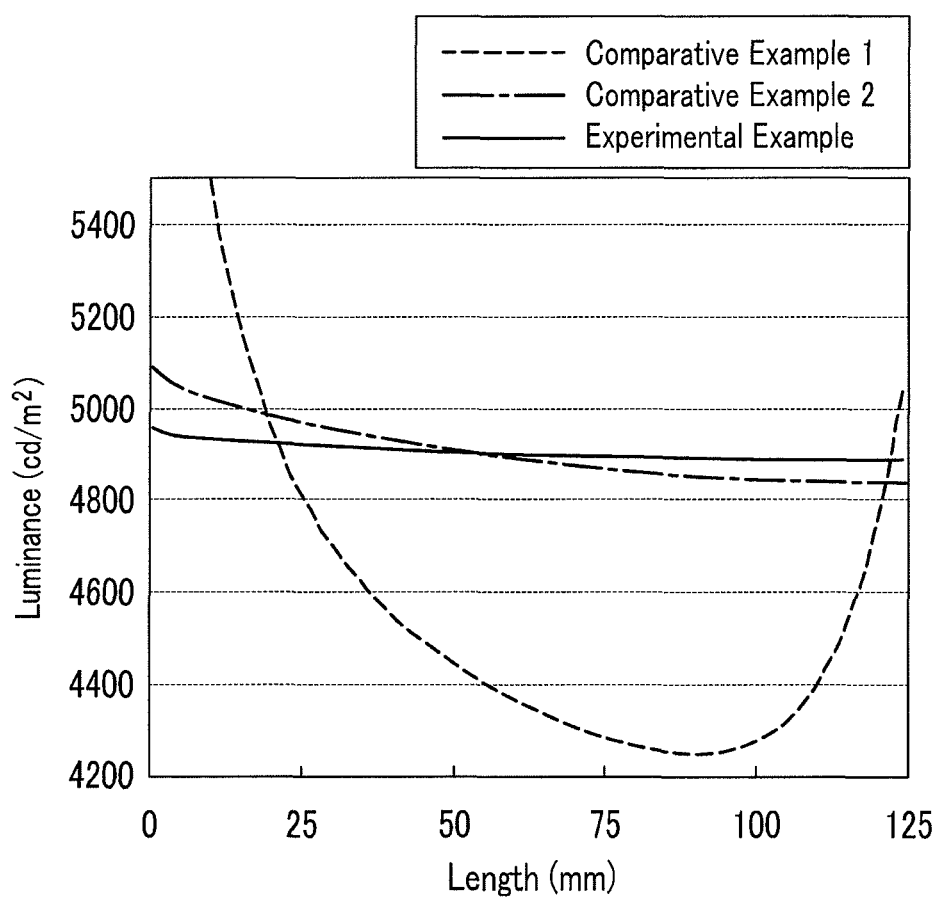
FIG. 6 is a graph showing luminance distributions of an experimental example and comparative examples.

Hereinafter, an experimental Example according to the first exemplary embodiment and comparative examples are described with reference to FIG. 6. FIG. 6 is a graph showing luminance distributions of an experimental example and comparative examples.

In Experimental Example 1, the auxiliary electrodes 170 made of aluminum (Al) were formed at a thickness of 5 μm, and at least part of the auxiliary electrode 170 was buried in the substrate main body 111. Further, the first electrode 710 made of ITO was formed at a thickness of 100 nm.

On the other hand, in Comparative Example 1, the auxiliary electrodes were not formed, and the first electrode made of ITO was formed at a thickness of 200 nm. Further, in Comparative Example 2, the auxiliary electrodes made of aluminum (Al) were formed at a thickness of 1 μm and were formed right on the substrate main body (for example, not buried in the substrate main body). The first electrode made of ITO was formed at a thickness of 200 nm.

From FIG. 6, it can be seen that, in Experimental Example 1, even though the first electrode 710 has a relatively thin thickness, luminance distribution is most uniform.

Furthermore, in Experimental Example 1, an overall sheet resistance value of the auxiliary electrodes 170 and the first electrode 710 was measured at 0.0095 ohm/sq. On the other hand, sheet resistance values of Comparative Example 1 and Comparative Example 2 were respectively measured at 10 ohm/sq and 0.0474 ohm/sq. As described above, it can be seen that Experimental Example 1 according to the first exemplary embodiment has a much lower sheet resistance value compared with Comparative Examples 1 and 2.

It will be appreciated by those skilled in the art that various modifications and changes may be made without departing from the scope of the present disclosure. It will also be appreciated by those of skill in the art that parts included in one embodiment are interchangeable with other embodiments; one or more parts from a depicted embodiment can be included with other depicted embodiments in any combination. For example, any of the various components described herein and/or depicted in the Figures may be combined, interchanged or excluded from other embodiments. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. Further, while the present disclosure has described certain exemplary embodiments, it is to be understood that the scope of the disclosure is not limited to the disclosed embodiments, but, on the contrary, is intended to cover various modifications and equivalent arrangements included within the spirit and scope of the appended claims and equivalents thereof.

What is claimed is:

1. An organic light-emitting diode lighting apparatus, comprising:
    a transparent substrate main body with a plurality of groove lines formed therein;
    auxiliary electrodes formed in at least one of the plurality of groove lines;
    a first electrode formed on the transparent substrate main body;
    positive temperature coefficients (PTCs) configured to connect the auxiliary electrodes and the first electrode;

an organic emission layer formed on the first electrode; and
a second electrode formed on the organic emission layer,
wherein the PTCs are formed within the plurality of respective groove lines along with the respective auxiliary electrodes.

2. The organic light-emitting diode lighting apparatus of claim 1, wherein the PTCs each comprise a pair of resistance electrodes and a polymer layer disposed between the pair of resistance electrodes.

3. The organic light-emitting diode lighting apparatus of claim 1, wherein the PTCs are formed on the plurality of groove lines.

4. The organic light-emitting diode lighting apparatus of claim 1 further comprising a thermistor insulating layer surrounding edges of the PTCs.

5. The organic light-emitting diode lighting apparatus of claim 1, wherein each of the auxiliary electrodes has a thickness in a range of about 2 μm to about 100 μm.

6. The organic light-emitting diode lighting apparatus of claim 5, wherein each of the plurality of groove lines has a depth of less than about 50% of a thickness of the transparent substrate main body.

7. The organic light-emitting diode lighting apparatus of claim 5, wherein each of the auxiliary electrodes has a width in a range of about 1 μm to about 50 μm.

8. The organic light-emitting diode lighting apparatus of claim 7, wherein a total area occupied by the auxiliary electrodes is less than or equal to about 15% of an area where the organic emission layer emits light.

9. The organic light-emitting diode lighting apparatus of claim 7, wherein the first electrode comprises transparent materials and the second electrode comprises reflective materials.

10. The organic light-emitting diode lighting apparatus of claim 9, wherein the first electrode has a thickness of about 200 nm or less.

11. The organic light-emitting diode lighting apparatus of claim 9, wherein the auxiliary electrodes comprise conductive reflection materials having lower specific resistance than that of the first electrode.

12. The organic light-emitting diode lighting apparatus of claim 11, wherein the transparent substrate main body comprises glass-based materials and the transparent substrate main body has a thickness in a range of about 0.2 mm to about 1.2 mm.

13. The organic light-emitting diode lighting apparatus of claim 11, wherein the transparent substrate main body comprises plastic-based materials and is formed at a thickness ranging from about 0.01 mm to about 1 mm.

14. The organic light-emitting diode lighting apparatus of claim 11 further comprising barrier rib layers formed between the first electrode and the second electrode, wherein the barrier rib layers are configured to overlap the respective auxiliary electrodes.

* * * * *